United States Patent
Black et al.

(10) Patent No.: US 8,471,734 B2
(45) Date of Patent: Jun. 25, 2013

(54) SYSTEM AND METHOD FOR CONFIGURATION OF A CONTROLLING DEVICE TO ENABLE SELECTION OF MEDIA STREAMS

(75) Inventors: Jeremy K. Black, N. Tustin, CA (US); Patrick H. Hayes, Mission Viejo, CA (US)

(73) Assignee: Universal Electronics Inc., Santa Ana, CA (US)

(*) Notice: Subject to any disclaimer, the term of this patent is extended or adjusted under 35 U.S.C. 154(b) by 1122 days.

(21) Appl. No.: 12/413,976

(22) Filed: Mar. 30, 2009

(65) Prior Publication Data
US 2010/0245134 A1    Sep. 30, 2010

(51) Int. Cl.
| | |
|---|---|
| *H03M 11/00* | (2006.01) |
| *H04L 17/02* | (2006.01) |
| *G05B 11/01* | (2006.01) |
| *H04Q 1/00* | (2006.01) |
| *G09G 5/00* | (2006.01) |
| *G06F 3/033* | (2006.01) |
| *G06F 3/00* | (2006.01) |
| *G06F 3/048* | (2006.01) |

(52) U.S. Cl.
USPC ....... 341/23; 341/176; 340/12.23; 340/12.28; 340/12.22; 340/5.61; 345/172; 345/168; 345/179; 715/716; 715/835

(58) Field of Classification Search
USPC .................. 340/3.1, 825.22, 825.69, 825.24, 340/825.25, 3.9, 3.7, 10.5, 3.71, 572.4, 572.1, 340/825.49, 5.64, 5.7, 569; 709/217, 203, 709/229; 455/418, 426; 345/156–179
See application file for complete search history.

(56) References Cited

U.S. PATENT DOCUMENTS

| | | | |
|---|---|---|---|
| 5,414,426 A | 5/1995 | O'Donnell et al. | |
| 5,579,002 A | 11/1996 | Iggulden et al. | |
| 5,793,414 A * | 8/1998 | Shaffer | 725/133 |
| 5,909,211 A * | 6/1999 | Combs et al. | 345/172 |
| 6,208,341 B1 * | 3/2001 | van Ee et al. | 715/716 |
| 7,193,661 B2 | 3/2007 | Dresti et al. | |
| 2002/0054146 A1 | 5/2002 | Fukumoto | |
| 2003/0066893 A1 * | 4/2003 | Yap et al. | 235/487 |
| 2004/0056789 A1 | 3/2004 | Arling et al. | |

(Continued)

FOREIGN PATENT DOCUMENTS
WO    2008/039364 A2    4/2008

OTHER PUBLICATIONS

International Preliminary Report on Patentability, PCT Application No. US2010/025496, Oct. 4, 2011, 5 pages.

*Primary Examiner* — Jennifer Mehmood
*Assistant Examiner* — Mirza Alam
(74) *Attorney, Agent, or Firm* — Greenberg Traurig, LLP

(57) ABSTRACT

A controlling device has a configurable key. An overlay, such as a sticker, is provided to the configurable key and includes an indicia representative of media content and machine readable data indicative of an identity of the media content represented by the indicia. A memory of the controlling device stores a correspondence between the configurable key and data indicative of a source of the media content. Upon activation of configured, configurable key, the controlling device uses select command codes from a library of command codes and the correspondence between the configurable key and the data indicative of the source of the media content to transmit one or more commands for causing one or more appliances to access the source of the media content.

20 Claims, 10 Drawing Sheets

U.S. PATENT DOCUMENTS

| | | | |
|---|---|---|---|
| 2004/0113892 A1* | 6/2004 | Mears et al. | 345/172 |
| 2005/0149971 A1* | 7/2005 | Hallberg | 725/52 |
| 2006/0050142 A1* | 3/2006 | Scott et al. | 348/14.05 |
| 2006/0262002 A1* | 11/2006 | Nguyen | 341/176 |
| 2007/0090968 A1* | 4/2007 | Nakamura | 340/825.72 |
| 2008/0094245 A1* | 4/2008 | Hardacker et al. | 340/825.22 |
| 2009/0033627 A1* | 2/2009 | Aasen | 345/168 |

* cited by examiner

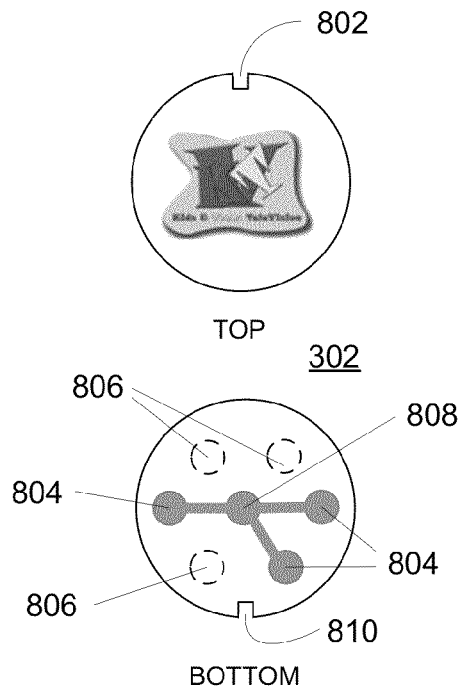
TOP
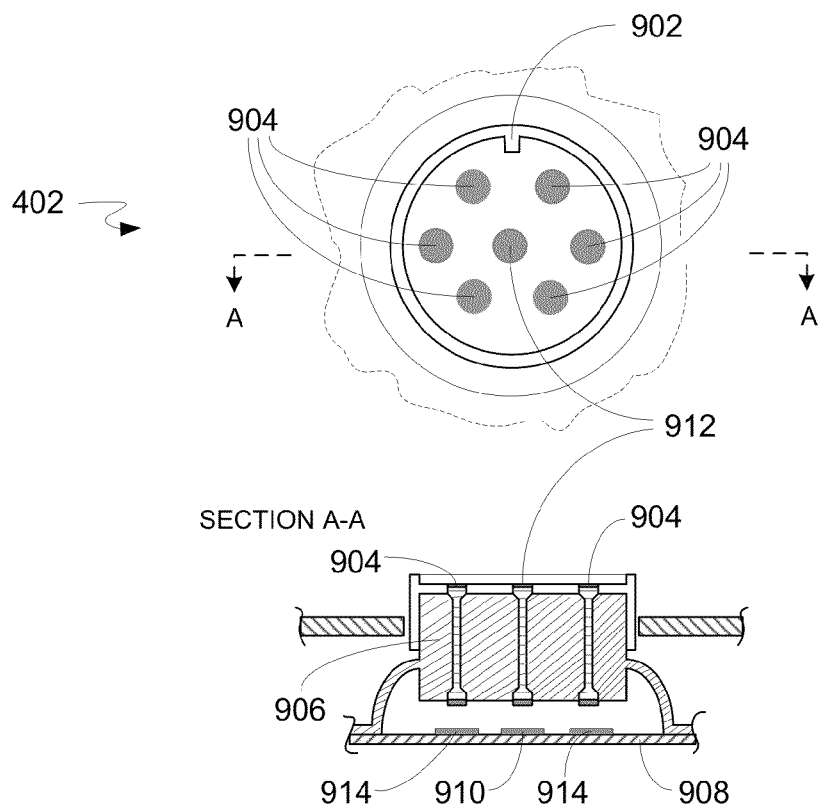
Figure 8
Figure 9

SYSTEM AND METHOD FOR CONFIGURATION OF A CONTROLLING DEVICE TO ENABLE SELECTION OF MEDIA STREAMS

BACKGROUND

This invention relates generally to controlling devices, for example, remote controls, and the features and functionality provided by such devices. Such controlling devices may be universal, i.e., adaptable to issue commands to a multiplicity of appliances of different manufacture and/or type; unified, i.e., adaptable to issue commands to a multiplicity of types of appliances of the same manufacture; and/or dedicated, i.e., adapted to issue commands to a specific device of specific type and manufacture.

A popular feature of such controlling devices is the ability to configure or program certain keys of the device to enable rapid access to a user's favorite content, e.g., TV channel, radio station, etc. To this end, various methods of configuring a controlling device to perform such functions have been proposed, for example U.S. Pat. No. 5,414,426 which describes a user-programmable favorite channel macro key, U.S. Pat. No. 7,193,661 which describes a system in which channel data may be downloaded from a set top box into a controlling device for future use in favorite channel selection, or U.S. patent application Ser. No. 12/206,181 which describes a yet further method for acquiring favorite channel information from a set top box.

Methods of labeling favorite content keys, once programmed, have also been previously proposed in the art. Many involve the use of an LCD or similar display on the controlling device, for example as described in U.S. patent application Ser. No. 11/312,303. Others, for example as represented by the Philips SRU4105 product (see Philips SRU 4105/27 *Owners Manual*, (undated), Ledgewood, N.J. 07852) provide a sheet of channel logo stickers which may be pasted next to a macro key after a user has manually programmed a channel tuning sequence onto that key.

Yet further, methods for configuring a controlling device keypad via placement of moveable keycaps have been proposed, such as for example described in U.S. Pat. No. 5,579,002 wherein the command function performed by each button is encoded in the button itself, thereby permitting any arbitrary keypad layout to be constructed by a user.

SUMMARY OF THE INVENTION

The following generally describes a system and method for convenient configuration of certain controlling device keys to provide direct access to user selected media streams, which method may not require direct user programming of command sequences, channel numbers, or the like. To this end, a controlling device may be provisioned with a group of buttons each adapted to receive an individual overlay, such as a sticker from a sheet of stickers provided in conjunction with the controlling device. Each overlay may be imprinted with visual indicia representative of a media content stream, for example a TV broadcast channel logo, and may further comprise encoded machine-readable information which serves to identify the desired media stream to the controlling device upon placement of the overlay to a key. The machine-readable information may take the form of an RFID tag, a conductive pattern on the underside of the overlay, etc. The controlling device is further equipped with cross-reference means which allows it to translate the information indicative of a media stream that is obtained from the overlay-populated keys into content selection command sequences appropriate for the site in which the controlling device is being used. Such translation means may take into account geographic location, service provider, type of tuning equipment in use, etc., and may be configured at a factory or distribution center based on the intended recipient of the unit, or may be configured locally via connection to PC and/or Internet based service.

A better understanding of the objects, advantages, features, properties and relationships of the invention will be obtained from the following detailed description and accompanying drawings which set forth illustrative embodiments and which are indicative of the various ways in which the principles of the invention may be employed.

BRIEF DESCRIPTION OF THE DRAWINGS

For a better understanding of the various aspects of the invention, reference may be had to preferred embodiments shown in the attached drawings in which:

FIG. 8 illustrates an exemplary sticker for use with an embodiment of the invention;

FIG. 9 illustrates an exemplary controlling device key adapted to receive the exemplary sticker of FIG. 8;

DETAILED DESCRIPTION

Figure 1:
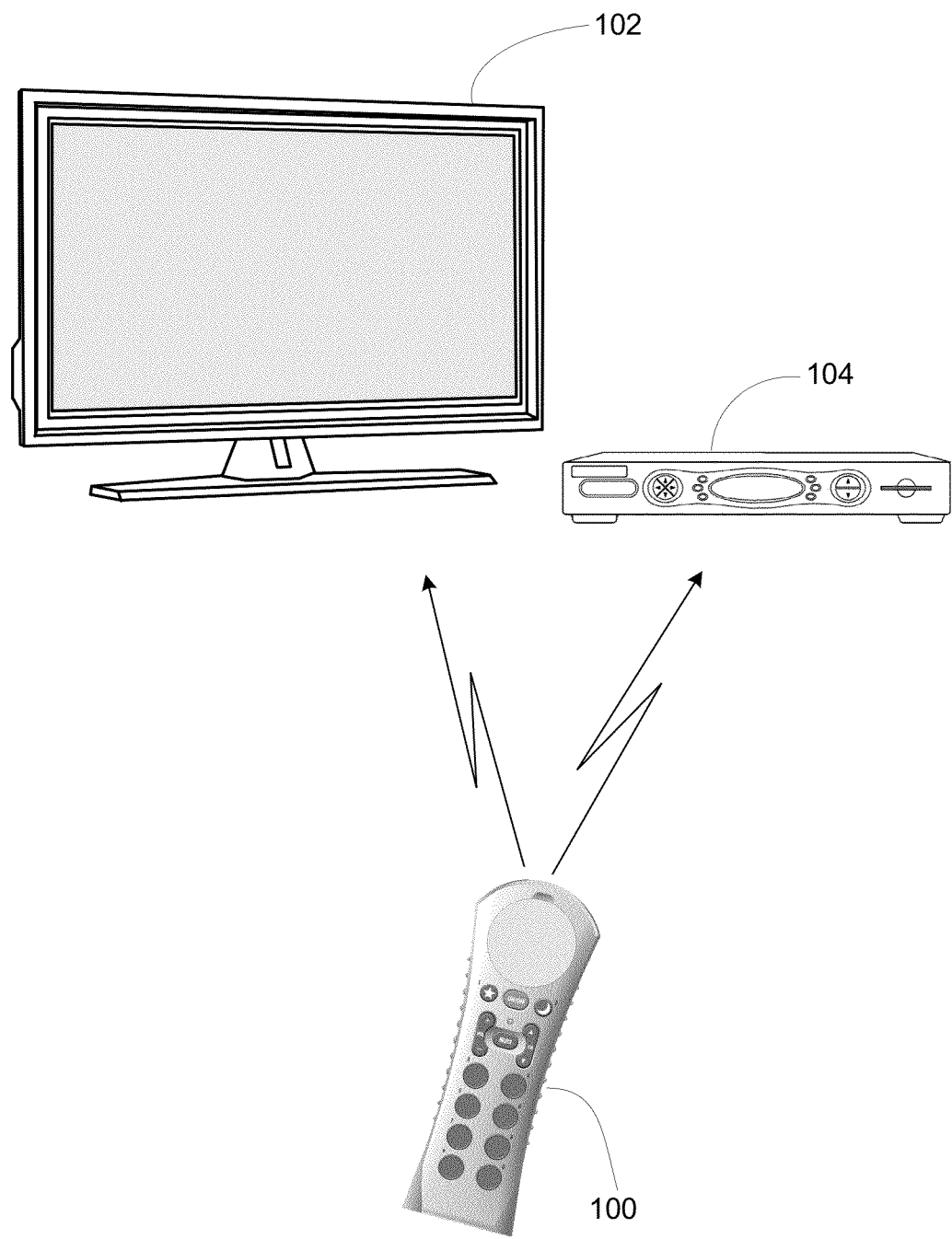
FIG. 1 illustrates an exemplary system in which an exemplary controlling device according to the instant invention may be used.

Turning now to FIG. 1, there is illustrated an exemplary system in which a controlling device 100 is configured to control various controllable appliances, such as a television 102 and a set top box ("STB") 104. While the universal controlling device presented in the exemplary system is representative of the broadest applicability of the instant invention, it will be appreciated that the teachings presented herein may be equally applied to unified and/or dedicated controlling devices. As is known in the art, the controlling device 100 is capable of transmitting commands to the appliances, using any convenient IR, RF, Point-to-Point, or networked protocol, to cause the appliances to perform operational functions. While illustrated in the context of a television 102 and STB 104, it is to be understood that controllable appliances may include, but need not be limited to, televisions, VCRs, DVRs, DVD players, cable or satellite converter set-top boxes ("STBs"), amplifiers, CD players, game consoles, home lighting, drapery, fans, HVAC systems, thermostats, personal computers, etc.

Figure 2:
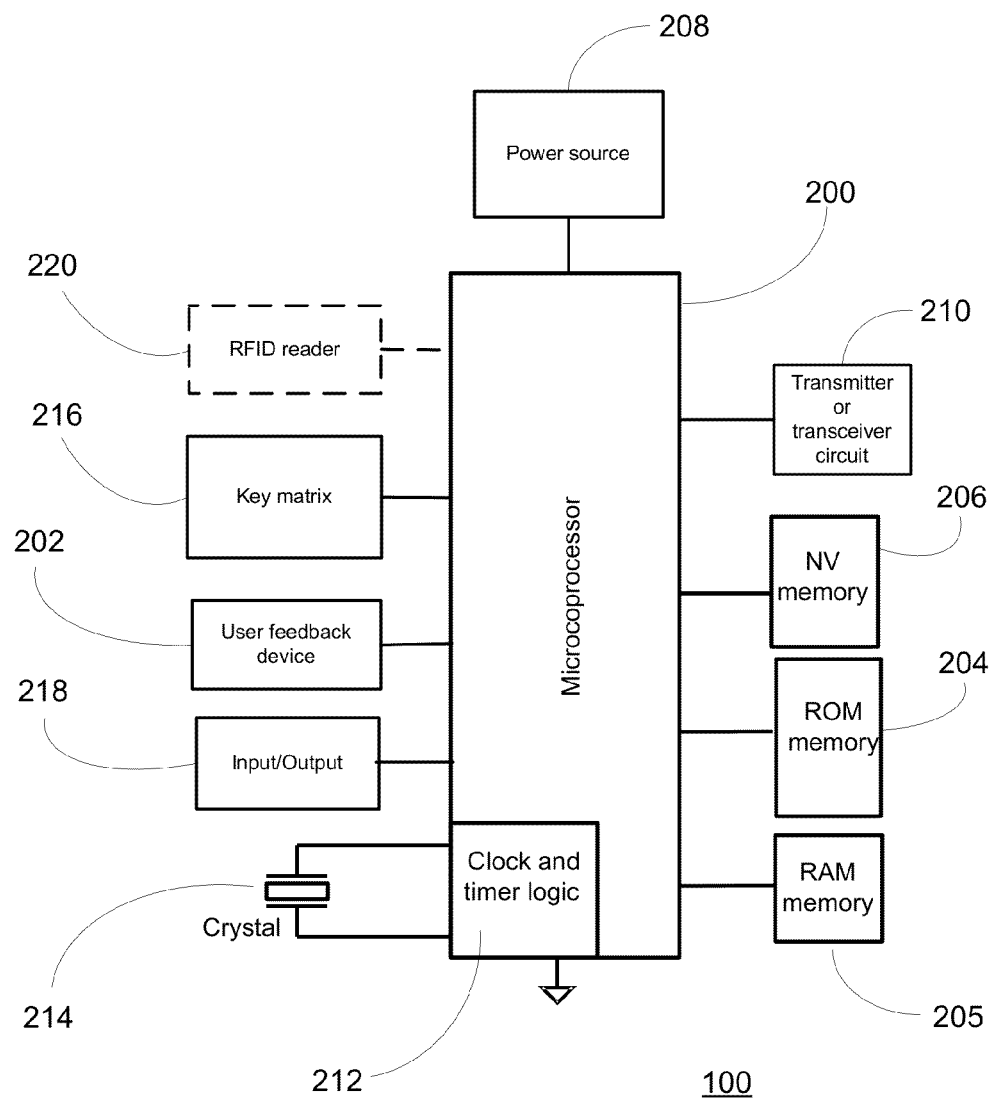
FIG. 2 illustrates a block diagram of exemplary components of the exemplary controlling device of FIG. 1.

With reference to FIG. 2, for use in commanding the functional operations of one or more appliances, the controlling device 100 may include, as needed for a particular application, a processor 200 coupled to a ROM memory 204, a RAM memory 205, a key matrix 216 (e.g., hard keys, soft keys such as a touch sensitive surface overlaid on a liquid crystal (LCD), and/or an electroluminescent (EL) display), transmission circuit(s) and/or transceiver circuit(s) 210 (e.g., IR and/or RF), a non-volatile read/write memory 206, a means 202 to provide feedback to the user (e.g., one or more LEDs, display, speaker, and/or the like), a power source 208, an input/output port 218 such as a serial interface, USB port, modem, Zigbee, WiFi, or Bluetooth transceiver, etc., clock and timer logic 212 with associated crystal or resonator 214, and in certain embodiments an RFID reader 220.

As will be understood by those skilled in the art, some or all of the memories 204, 205, 206 may include executable instructions (collectively, the program memory) that are intended to be executed by the processor 200 to control the operation of the remote control 100, as well as data which serves to define to the operational software the necessary control protocols and command values for use in transmitting command signals to controllable appliances (collectively, the command data). In this manner, the processor 200 may be programmed to control the various electronic components within the remote control 100, e.g., to monitor the power supply 208, to cause the transmission of signals, etc. The non-volatile read/write memory 206, for example an EEPROM, battery-backed up RAM, FLASH, Smart Card, memory stick, or the like, may additionally be provided to store setup data and parameters as necessary. While the memory 204 is illustrated and described as a ROM memory, memory 204 can also be comprised of any type of readable media, such as ROM, FLASH, EEPROM, or the like. Preferably, the memories 204 and 205 are non-volatile or battery-backed such that data is not required to be reloaded after battery changes. In addition, the memories 204, 205 and 206 may take the form of a chip, a hard disk, a magnetic disk, an optical disk, and/or the like. Still further, it will be appreciated that some or all of the illustrated memory devices may be physically combined (for example, a single FLASH memory may be logically partitioned into different portions to support the functionality of memories 204 and 206 respectively), and/or may be physically incorporated within the same IC chip as the microprocessor 200 (a so called "microcontroller") and, as such, they are shown separately in FIG. 2 only for the sake of clarity.

To cause the controlling device 100 to perform an action, the controlling device 100 is adapted to be responsive to events, such as a sensed user interaction with the key matrix 216, etc. In response to an event, appropriate instructions within the program memory (hereafter the "operating program") may be executed. For example, when a function key is actuated on the controlling device 100, the controlling device 100 may retrieve from the command data stored in memory 204, 205, 206 a command value and control protocol corresponding to the actuated function key and, where necessary, current device mode and transmit that command to an intended target appliance, e.g., STB 104, in a format recognizable by that appliance to thereby control one or more functional operations of that appliance. It will be appreciated that the operating program can be used not only to cause the transmission of commands/or data to the appliances, but also to perform local operations. While not limiting, local operations that may be performed by the controlling device 100 may include displaying information/data, favorite channel setup, macro key setup, function key relocation, etc. Examples of local operations can be found in U.S. Pat. Nos. 5,481,256, 5,959,751, and 6,014,092.

For selecting sets of command data to be associated with the appliances to be controlled (hereafter referred to as a setup procedure), data may be entered into the controlling device 100 that serves to identify each intended target appliance by its make, and/or model, and/or type. The data is typically entered via activation of those keys that are also used to cause the transmission of commands to an appliance, preferably the keys that are labeled with numerals. In other instances, keys which are normally assigned to other command functions may temporarily represent numeric values during entry of such appliance identification data, for example the keys of the controlling device illustrated in FIG. 4 which have adjacent thereto numeric labels 430. Such data allows the controlling device 100 to identify the appropriate command data set within a preprogrammed library of command data that is to be used to transmit recognizable commands in formats appropriate for such identified appliances. The library of command data may represent a plurality of controllable appliances of different types and manufacture, a plurality of controllable appliances of the same type but different manufacture, a plurality of appliances of the same manufacture but different type or model, etc., or any combination thereof as appropriate for a given embodiment. In conventional practice as is well known in the art, such data used to identify an appropriate command data set may take the form of a numeric setup code (obtained, for example, from a printed list of manufacturer names and/or models with corresponding code numbers, from a support Web site, etc.). Alternative setup procedures previously proposed in the art include scanning a bar code or an electronic product code (EPC), sequentially transmitting a predetermined command in different formats until a target appliance response is detected, interaction with a Web site culminating in downloading of command data and/or setup codes to the controlling device, etc. Since such methods for setting up a controlling device to command the operation of specific home appliances are well-known, these will not be described in greater detail herein. Nevertheless, for additional information pertaining to setup procedures, the reader may turn, for example, to U.S. Pat. Nos. 4,959,810, 5,614,906, or 6,225,938 all of like assignee and incorporated herein by reference in their entirety.

Figure 3:
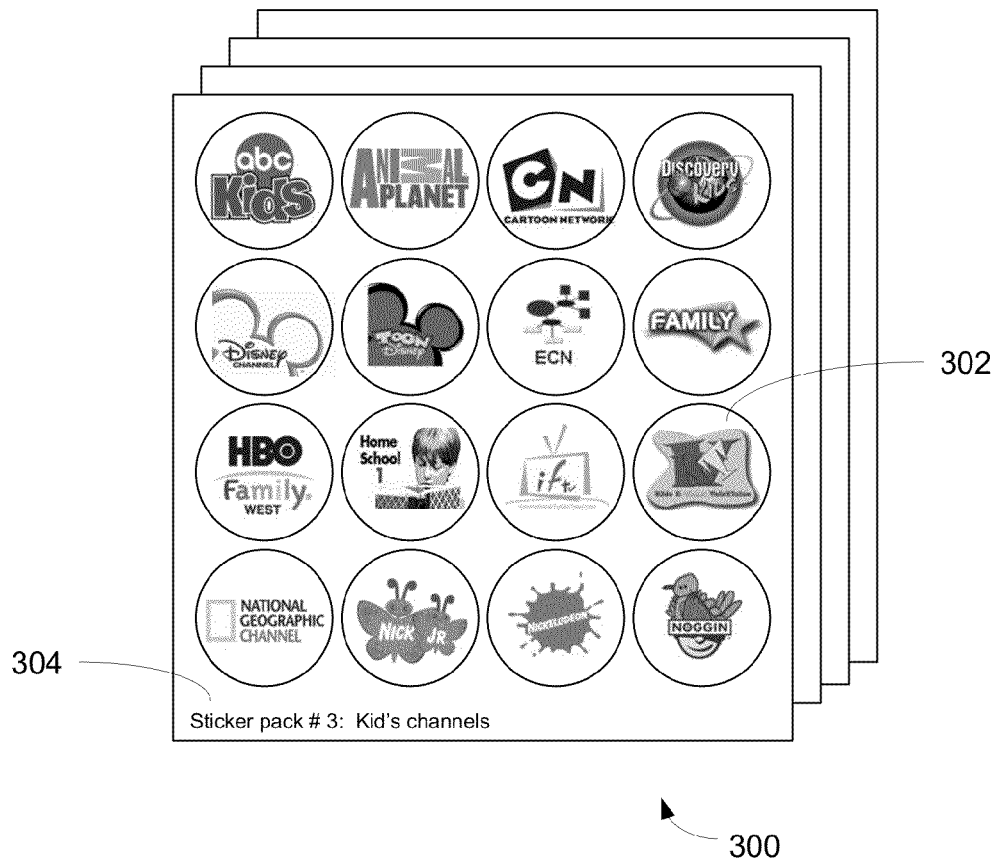
FIG. 3 illustrates an exemplary sheet of media stream selection stickers in accordance with this invention.
Figure 4:
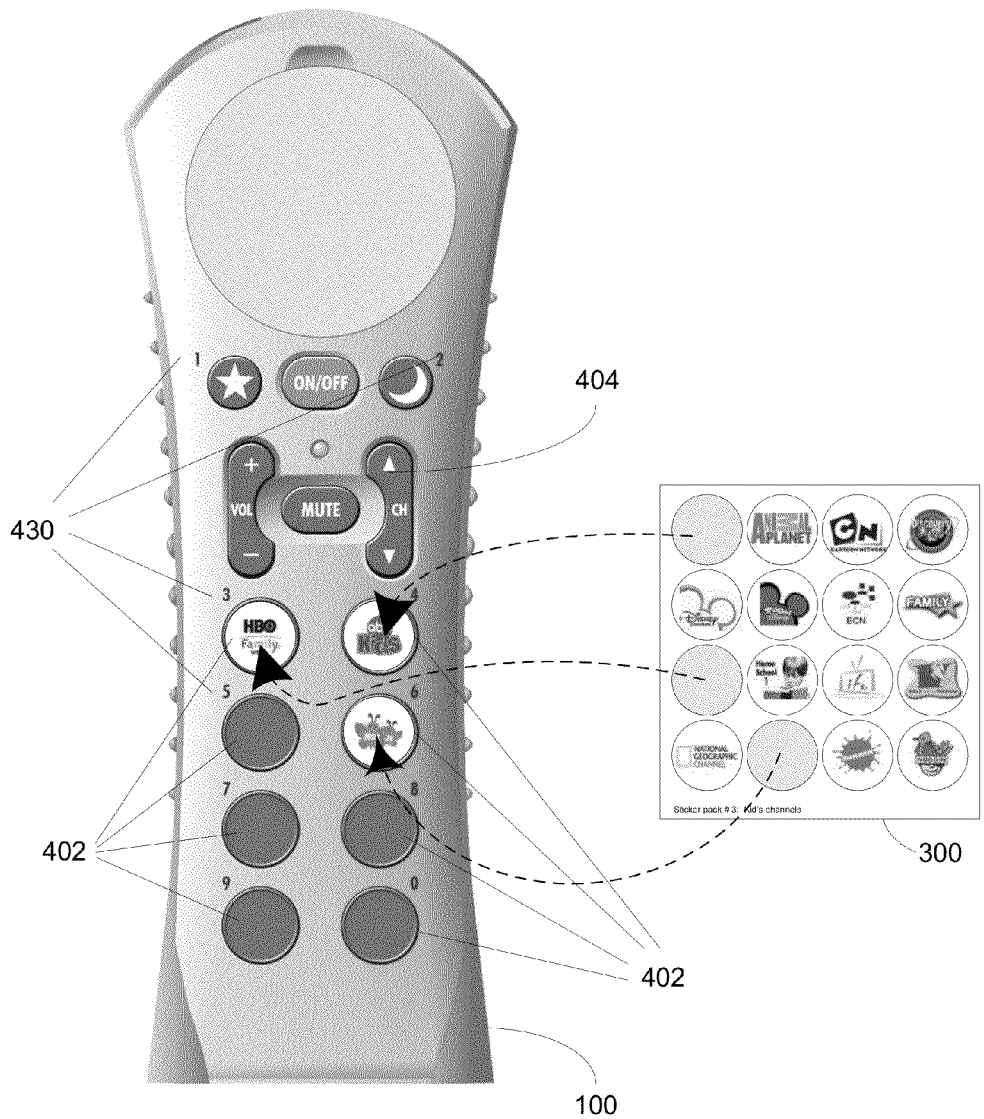
FIG. 4 illustrates an exemplary controlling device adapted to receive the media stream selection stickers of FIG. 3.

To facilitate rapid and convenient setup of controlling device keys which may be used to directly access a media stream, a controlling device 100 may be provided with one or more configurable, blank keys or buttons 402 each adapted to receive an overlay, such as an individual sticker detached from a provided sheet of stickers 300 as illustrated for example in FIGS. 3 and 4. Each overlay may include visual indicia representative of a media stream, for example a content provider name or logo, an icon representative of a media type, etc., as well as encoded controlling device-readable data representative of the media steam which corresponds to that indicia, as will be described in greater detail hereafter. As illustrated in FIG. 4, during a configuration process a user of controlling device 100 may, in the example case of stickers, detach stickers corresponding to their favorite media stream(s) from sheet 300 and attach them to vacant configurable keys of controlling device 100.

The implementation of such a configuration process in an exemplary embodiment will now be described in further detail with reference to FIG. 5. In reviewing this and other flowcharts of the instant disclosure, it will be appreciated that certain common elements well known in the art such as, for example, stuck key timeouts, low battery detection, etc. have been omitted for the sake of clarity, and also that the use of the term "step" herein is not intended to imply a required order to carry out the actions described and that the designated numbers are for convenience of reference only. Initially, at step 502 the operating program of controlling device 100 may be placed into a configuration mode via, for example, activation of a switch in the battery compartment. Alternative methods for initiating this mode, for example entry of a unique key sequence, simultaneous activation of multiple keys, etc., as are well known in the art, may be used in other embodiments. Once in the configuration mode, the operating program may wait for either a key press at step 504 or deactivation of the configuration switch at step 506. If the switch is deactivated, the operating program exits the configuration mode at step 508. When a key press is detected, the operating program first checks at step 510 that the activated key is in fact one the configurable keys 402. If not (e.g., a power or volume command key was inadvertently activated) an error is signaled at step 512 after which the operating software resumes waiting for a next event at step 504. Otherwise, the operating software retrieves the media stream identity data encoded on the overlay placed on at least the activated key. It will be appreciated that the act of physically applying pressure to adhere a sticker to a key will also activate that key in the event the sticker is placed upon the key after commencement of the configuration process. However, if necessitated by a particular embodiment, a user may be instructed to ensure activation occurs by pressing down on the key until, for example, an indication such as a LED flash, beep, etc., is provided by the controlling device. Methods for encoding and retrieving media stream identity data on keycap overlays will be discussed in greater detail hereafter. Having retrieved the media stream identity data associated with the overlay just placed, the operating program of controlling device 100 at step 516 next checks that the indicated stream is in fact available. This check may be performed using a channel map table 640 which will be further described hereafter. If the media stream is available, the operating program updates key assignment table 602 with the data indicative of the desired media stream.

Figure 5:
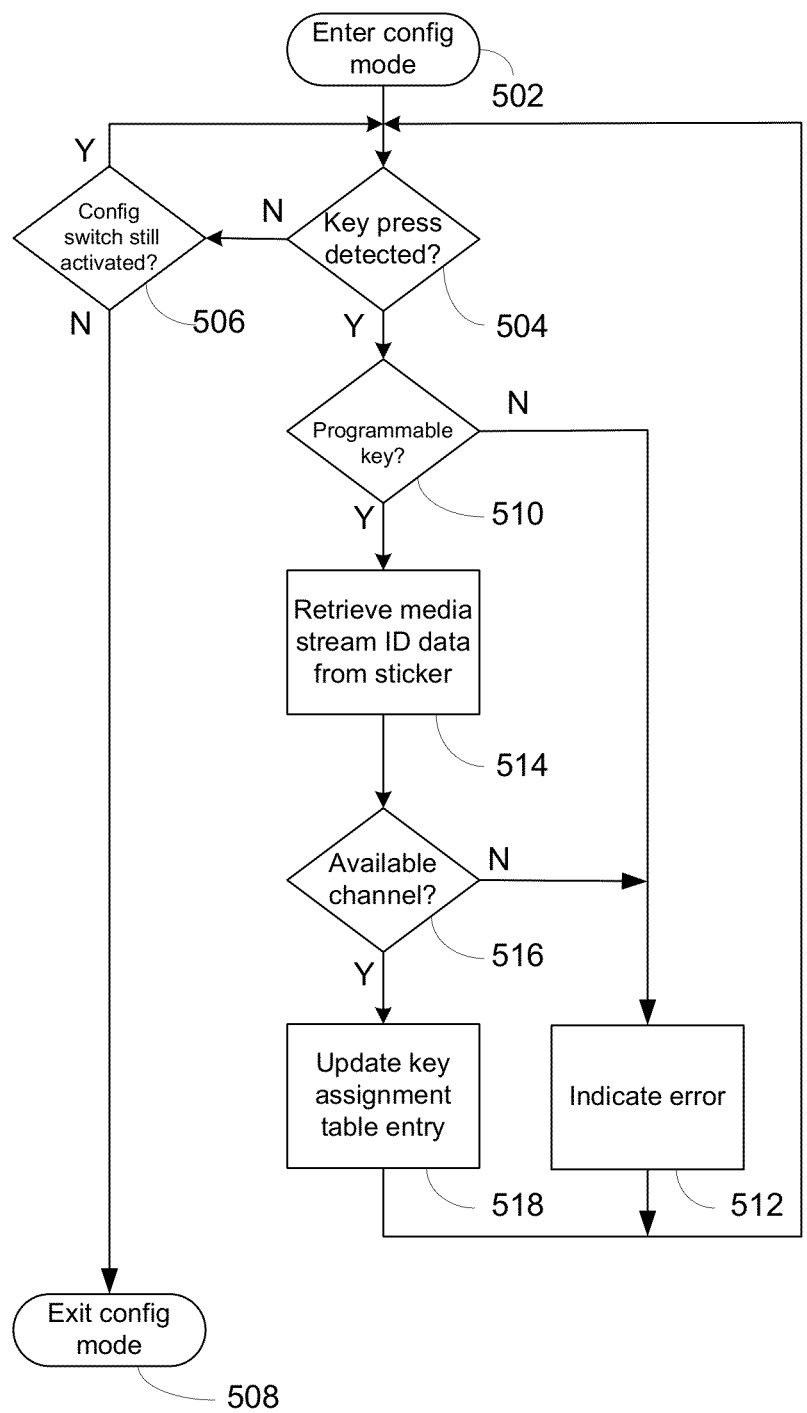
FIG. 5 illustrates in flowchart form an exemplary configuration method for the controlling device of FIG. 4.
Figure 6:
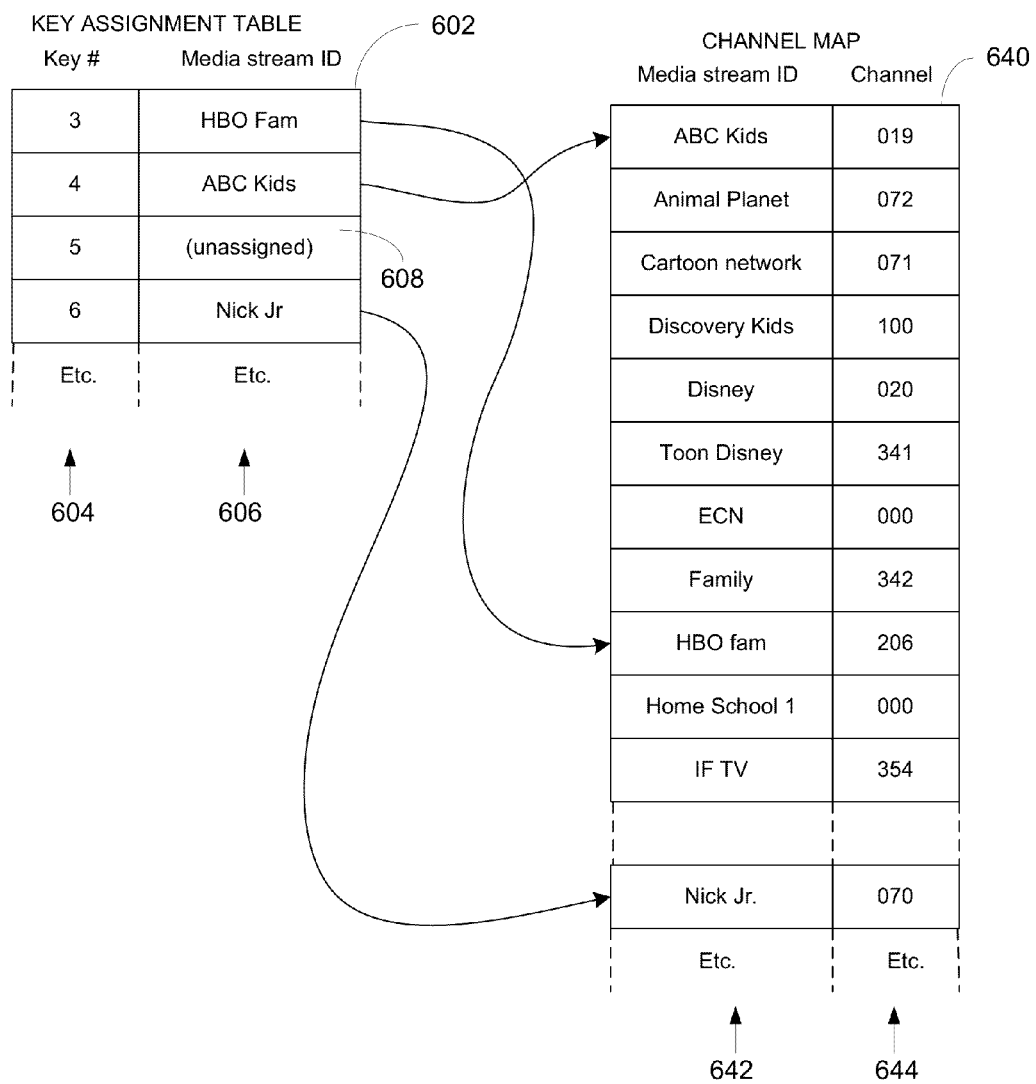
FIG. 6 illustrates exemplary memory tables for use in the selection of media streams in response to key presses on the controlling device of FIG. 4.
Figure 7:
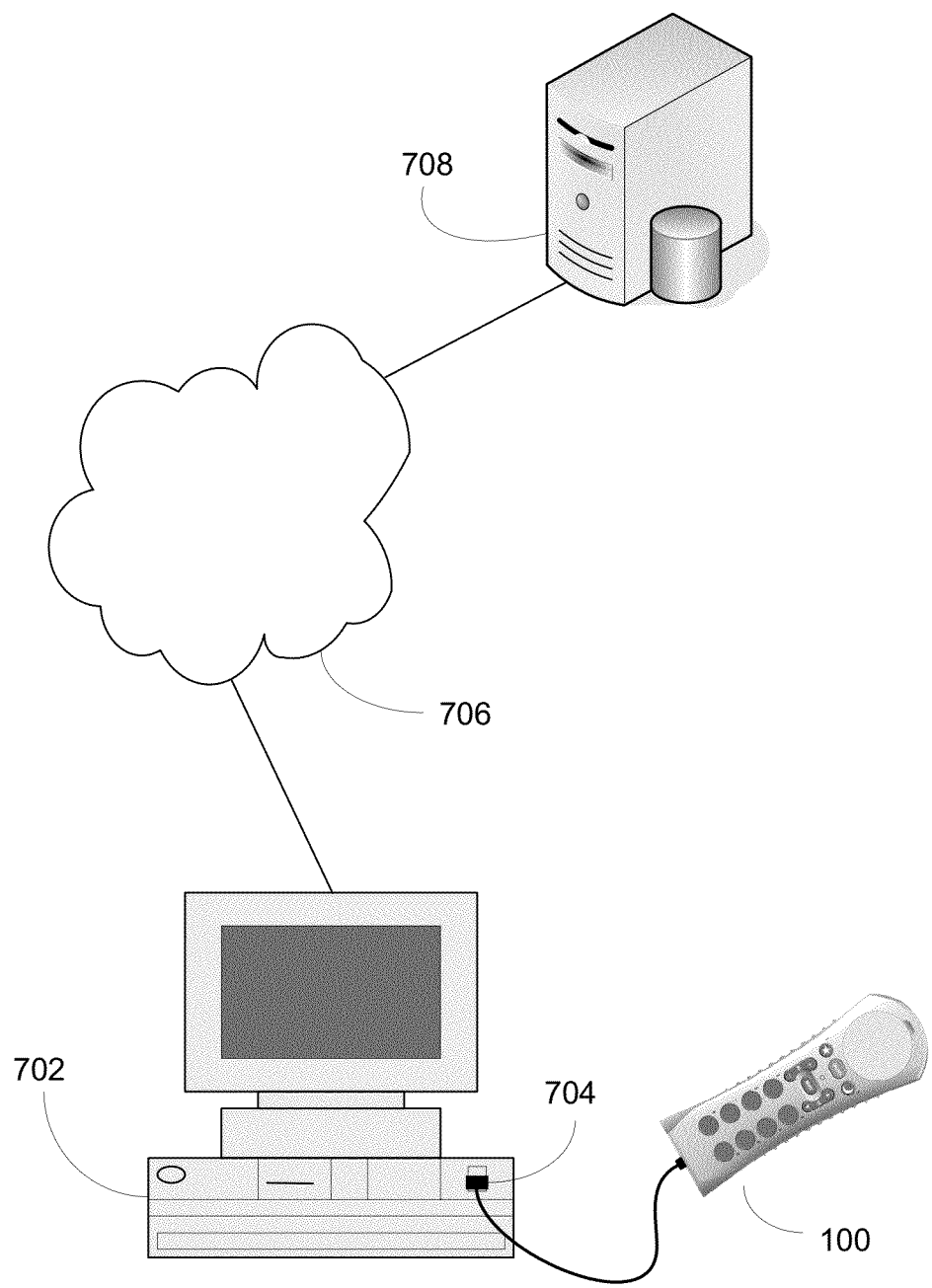
FIG. 7 illustrates an exemplary remote server and method for configuring one of the tables of FIG. 6.

Turning now to FIG. 6, there is illustrated an exemplary key assignment table 602 and an exemplary channel map table 640 which may be used in an embodiment of the instant invention, both preferably stored in non-volatile memory e.g., 206. Key assignment table 602 cross-references physical key locations 604 (corresponding to configurable keys 402) to the media stream identities 606 of the overlays installed on those keys, configured as described above in conjunction with the flowchart of FIG. 5. Channel map table 640 cross-references media streams 642 to channel numbers 644 or other data suitable for use in constructing appliance command sequences for selection of those streams. It will be appreciated that while the illustrative media stream identity entries of tables 602 and 640 are presented in the form of descriptive text to facilitate readability, in practice these identities may comprise numbers, binary values, coded text, call signs, channel allocations, etc., as appropriate for a particular implementation. In this context, it will be also be appreciated that the channel map table 640 may vary depending upon one or more of a current location of a controlling device, e.g., its geographic situation, source of content, e.g., cable provider, satellite provider, etc., level of service subscribed to, etc. By way of example, location data that may be used in the creation of a channel map table such as 640 may include zip code, service provider (e.g., cable MSO, satellite system, etc.), and level of service (e.g., standard, HD, premium, etc.). Channel map 640 may be loaded into the memory 206 of controlling device through for example input/output port 218, at time of manufacture, at time of shipment to a particular region or customer, by a dealer at point of sale, directly by a consumer either via manual data entry or interaction with a PC application and/or Internet Web site, etc. as appropriate. As further illustrated in FIG. 7, a channel map table may be configured by the entry of data such as zip code, service provider, etc. into an application running on a PC 702 which application may then forward the entered data to an Internet 706 based server 708 which may construct a suitable channel map table and return this to PC 702 for download into controlling device 100 via a USB connection 704. It will be appreciated that, in keeping with the possible scenarios listed above, PC 702 may be located at a distribution center, a retail sales location, a user's home, etc. and further that in the case of a retail dealership or distributor, a channel map table, once configured, may be repeatedly loaded into multiple controlling devices.

In an alternative embodiment, a user may populate the configurable keys of a controlling device with overlays for the desired content streams prior to the initialization of a channel map table (e.g., in a manner similar to that illustrated in the flowchart of FIG. 5, but omitting step 516), whereafter controlling device 100 may be connected to a PC 702 and the media stream identity data from the populated keycaps forwarded to server 708 together with zip code and service provider information, in order to produce a customized channel map table specific to the overlay choices selected. It will be further appreciated that in certain embodiments multiple sets of overlays, e.g., sticker sheets, may be made available to a consumer by way of purchase or otherwise, for example one set which may represent content appropriate for viewing by children, another set which may represent sports-oriented content, another set which may represent educational content, etc., and as such the identity 304 of the overlay set being utilized may also form part of the information reported to server 708 for use in constructing a channel map table. Such an approach may be advantageous, for example, in situations where a very large number of channels are available from a particular service provider and controlling device memory available for storage of a channel map table is limited. Additionally, in certain embodiments, channel map table data may be downloaded into a controlling device over a PSTN connection using technology such as described in U.S. Pat. No. 5,537,463 "Magnetic modem in a remote control", incorporated herein by reference in its entirety, as an alternative to a PC and Internet connection. In such instances, information used to construct the table data may be supplied by user interaction with a customer service representative, touch-tone input, etc., as appropriate in a voice communication network.

Turning now to FIGS. 8 and 9, a method for encoding and reading media stream identity data on a keycap is illustrated. A portion of an overlay, such as the underside of a sticker 302, may be defined to include a pattern of six possible contact points 804, 806. Selected contact points 804 which correspond to a particular media stream identity are provided with pads of conductive material and are linked via strips of the same material to a central contact point 808. The conductive material used may comprise conductive ink, foil, etc. as appropriate for the overlay manufacturing process used. In the case of stickers, a suitable adhesive is applied to the balance of the area 810 not associated with the contact points 804, 806, 808. The button(s) 402 of controlling device 100 include a series of contact pins 904 positioned to engage with contact points 804, 806 of an overlay 302. A notch 802 in the overlay 302 and corresponding peg 902 in key 402 may also be provided to ensure correct alignment of overlay 302 with respect to contacts 904, 912. As is evident in section view A-A of key 402, contact pins 904, 912 extend all the way through keypad material 906 (typically a silicon rubber compound, as is well known in the art) and protrude through the underside so as to make contact with designated areas of printed circuit board 908 when the key is depressed. In this manner, when a sensing signal is applied to central pin 912 via printed circuit board contact 910, this signal may be detected at those peripheral contacts 914 which correspond to populated conductive pads 804 on overlay 302, and may not be detected at those peripheral contacts corresponding to non-populated pad locations 806 on overlay 302. In the embodiment illustrated the six possible contact points on the underside of overlay 302 may thus be used to encode a 6-bit binary number, i.e., up to 64 unique content stream identities. As will be appreciated, in other embodiments a greater or smaller number of contact points may be provisioned as appropriate.

Figure 10:
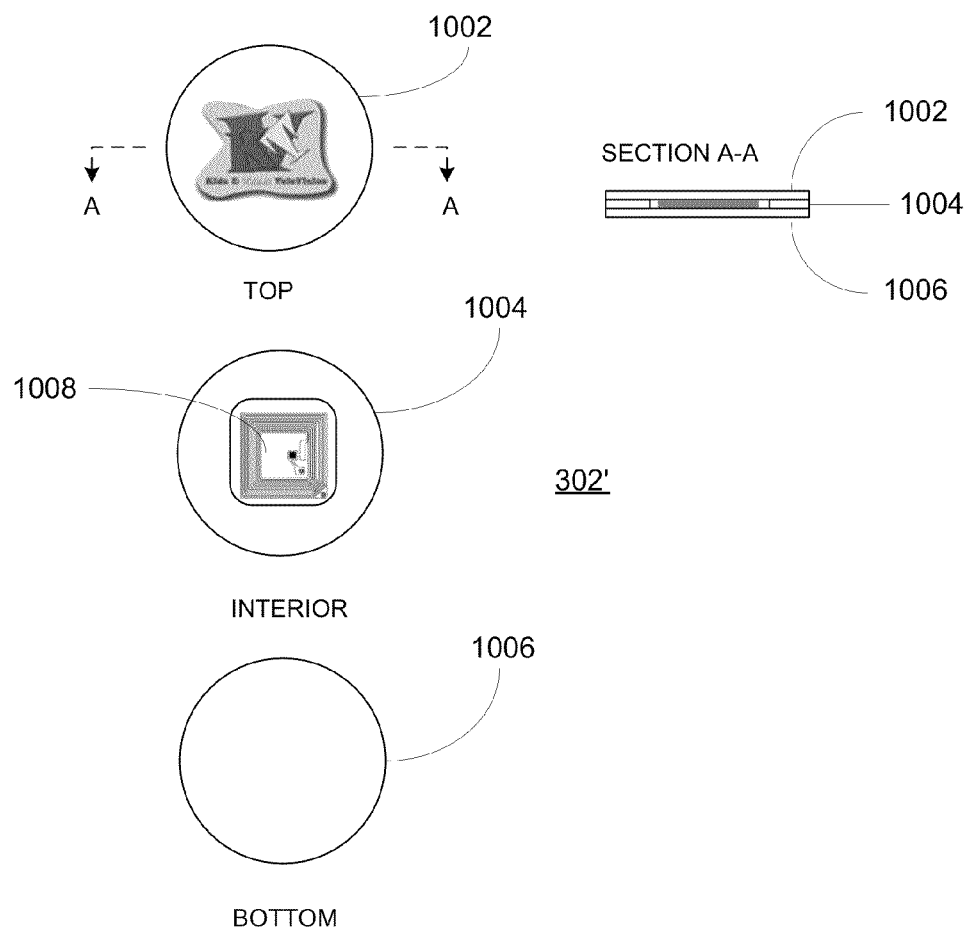
FIG. 10 illustrates a second exemplary sticker for use with an embodiment of the invention.

In an alternative embodiment, controlling device 100 may be equipped with an RFID reading capability 220, either expressly for the purposes described below or for the purpose of identifying target controlled devices via EPC interrogation as described, for example, in U.S. patent application Ser. No. 10/665,642 of like assignee and incorporated by reference herein in its entirety. In such cases, an alternative method of encoding media stream identity information on an overlay may employ RFID technology. As illustrated in FIG. 10, an exemplary overlay 302' suitable for use in this embodiment of the invention may comprise three layers: an upper surface 1002 carrying indicia artwork, a lower surface 1006 carrying adhesive for attachment to a controlling device key 402, and a center layer 1004 sandwiched between surfaces 1002 and 1006 in which may be embedded a passive RFID transponder or "tag" 1008. Since such RFID tags and related technology are well known in the art, for the sake of brevity these will not be described in great detail herein, however for further information the interested reader may turn, for example, to publications such as *RFID Essentials* (Glover, B., Bhatt, H. (2006). Sebastapol, Calif.: O'Reilly. ISBN: 0-596-00944-5) or *RFID Handbook* (Finkenzeller, K. (tr. Waddington, R.) (2003). Hoboken, N.J.: Wiley & Sons. ISBN 0-470-84402-7) both of which are incorporated herein by reference in their entirety.

Figure 11:
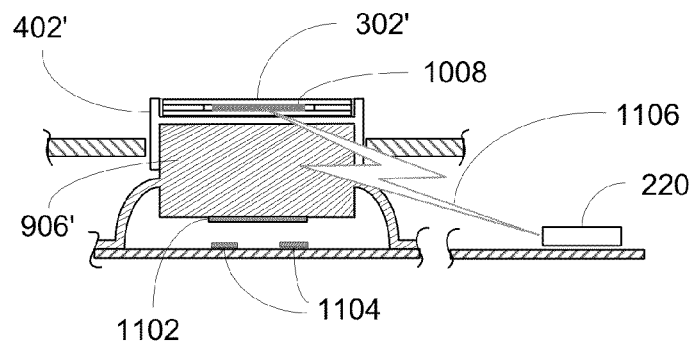
FIG. 11 illustrates a exemplary controlling device key adapted to receive the second exemplary sticker of FIG. 10.

As illustrated in FIG. 11, a controlling device key 402' adapted to receive an RFID enabled overlay 302' may include a flexible keypad 906' in which a conductive puck 1102 bridges a pair of PCB contacts 1104 when the key is depressed, as is well known in the art. When the operating program of controlling device 100 is in the configuration mode, completion of this circuit will cause RFID reader 220 to issue an interrogation signal 1106 to RFID tag 1008, corresponding to step 514 of FIG. 5. As is known it the art, the coupling between RFID tag 1008 and reader 220 may comprise one or more of backscatter (reflective), inductive, capacitive, etc., methods as appropriate for the tag type of a particular embodiment. As will be appreciated, in an RFID environment the RFID tags of all currently installed overlays may be responsive to an interrogation request issued by RFID reader 220. Methods for managing such multiple responses in an orderly manner are well known in the RFID art, for example via various forms of collision avoidance using randomly generated response delays ("Aloha" protocol), random selection of time slots ("Slotted Aloha"), binary tree bit-by-bit interrogations ("Adaptive Binary Tree"), etc., with or without repetitive interrogations interspersed with "sleep" commands issued to tags which have already responded. In general, the particular method used for such singulation of tags is dictated by the tag type and protocol selected. Further information in this regard may be found in the previously referenced *RFID Essentials* or *RFID Handbook*, or in the various standards enumerated therein. Accordingly, the operating software of this exemplary embodiment, upon completion of any necessary singulation process which results in identification of multiple responses to a RFID interrogation signal, may scan key assignment table 602 to eliminate those responses received from overlays which were previously installed on controlling device 100. By way of example with reference to FIG. 6, when the operating software functioning in the configuration mode detects that key number five, corresponding to unassigned table entry 608, has been activated by the placement of an overlay, the operating software will ignore any RFID responses containing media stream identities corresponding to "HBO Fam", "ABC Kids" or "Nick Jr." since these correspond to overlays which have previously been installed and entered into key assignment table 602.

Figure 12:
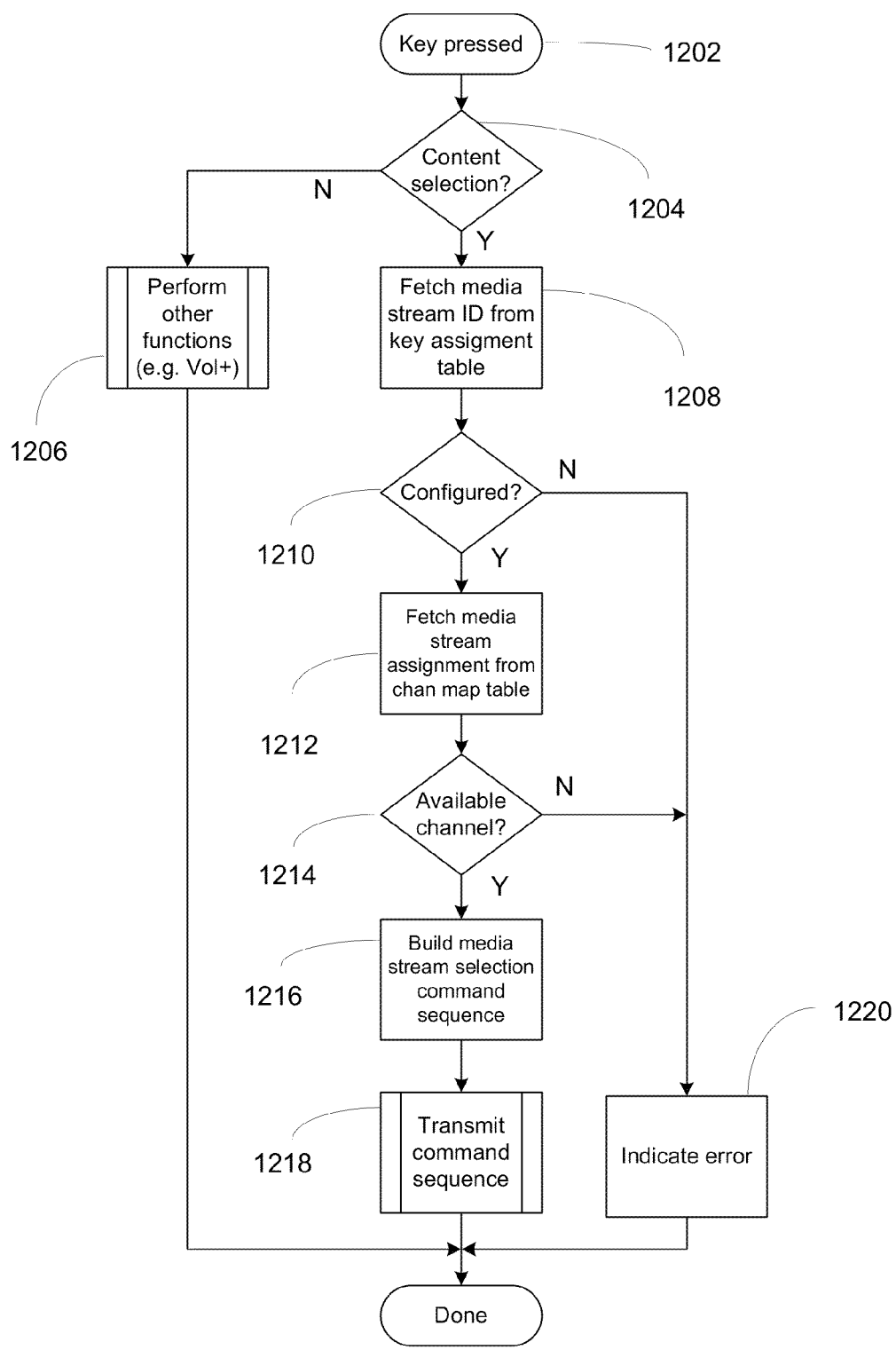
FIG. 12 illustrates in flow chart form an exemplary method of operation of the controlling device of FIG. 4.

Turning now to FIG. 12, during normal operation of controlling device 100, upon activation 1202 of a key of key matrix 216, the operating software at step 1204 first checks if the activated key matrix position corresponds to one of the content selection keys 402. If not, at step 1206 the operating software performs other command functions as defined for the activated key, for example transmitting a "channel up" command to the indicated tuning device if key 404 was activated. If however, a content selection key has been activated, at step 1208 the operating software retrieves the corresponding media stream identity from key assignment table 602. If the activated key has not been configured (i.e., no overlay has been applied there to) at step 1220 an error condition is indicated to the user, for example by flashing an LED, beeping, etc. and processing is complete. Alternatively, a default media stream selection or other action to be performed by unassigned selection keys may be established, either as part of channel map table 640 or elsewhere. By way of example only, such a default may result in the display of a program guide, may result in display of instructional material regarding how to configure remote control 100, may result in selection of a service provider's "home" page, etc. If a media stream identity is configured, at step 1212 the operating software fetches channel assignment data 644 from channel map table 640. At step 1214, if no entry exists in table 640 which corresponds to the requested media stream identity an error condition is reported as before. In this context it will be appreciated that a one-time check at configuration time as illustrated for example at step 514 of FIG. 5, may in general be insufficient for certain embodiments where channel lineup and service offering changes could result in subsequent updates to channel map table 640. If, however, the channel information is successfully retrieved from table 640, at step 1216 an appropriate command sequence is constructed which, when transmitted to the controlled appliance(s) at step 1218, will result in selection of the desired media stream. Methods for construction and user parameterization of channel tuning command sequences are well known in the art, nevertheless, for additional background on this subject reference may be had to U.S. patent application Ser. No. 10/287,389, of like assignment and incorporated herein by reference in its entirety.

While various concepts have been described in detail, it will be appreciated by those skilled in the art that various modifications and alternatives to those concepts could be developed in light of the overall teachings of the disclosure. For example, in an alternate embodiment using overlays and keys of the type described in conjunction with FIGS. 8 and 9, it will be appreciated that overlay decoding may be performed upon every key press event, and not just in a configuration mode, i.e., the steps illustrated in the flowchart of FIG. 5 may instead be performed in place of step 1208 of FIG. 12. Further, while certain methods of encoding media stream identity data onto overlays are presented by way of example in the embodiments described above, it will be appreciated that various other technologies, for example hall effect, electroacoustic (SAW) techniques, magnetic stripe or dot encoding, optical readers, bar codes, etc. may alternatively be utilized in implementing the teachings of this invention. It is to be further appreciated that, while described in the context of stickers, the overlays may be implemented using different embodiments, such as by being in the form of inserts that are to be slid into a slot, chamber, etc. formed in the keys, as being in the form of caps adapted to be placed into snap-fit engagement with the keys, etc., each embodiment of which is collectively referred to as "an overlay."

Additionally, while exemplary embodiments are illustrated in the context of broadcast television content selection, it will be appreciated that controlling devices intended for use with other sources of media content, for example satellite radio, CD or DVD playback, video-on-demand services, Internet radio, etc., may equally benefit from the methods described herein.

While described in the context of functional modules and illustrated using block diagram format, it is to be understood that, unless otherwise stated to the contrary, one or more of the described functions and/or features may be integrated in a single physical device and/or a software module, or one or more functions and/or features may be implemented in separate physical devices or software modules. It will also be appreciated that a detailed discussion of the actual implementation of each module is not necessary for an enabling understanding of the invention. Rather, the actual implementation of such modules would be well within the routine skill of an engineer, given the disclosure herein of the attributes, functionality, and inter-relationship of the various functional modules in the system. Therefore, a person skilled in the art, applying ordinary skill, will be able to practice the invention set forth in the claims without undue experimentation. It will be additionally appreciated that the particular concepts disclosed are meant to be illustrative only and not limiting as to the scope of the invention which is to be given the full breadth of the appended claims and any equivalents thereof.

All patents cited within this document are hereby incorporated by reference in their entirety.

What is claimed is:

1. A configurable controlling device comprising:
a key matrix including at least one configurable key adapted to receive an overlay comprising indicia representative of a media source having an associated media content that is accessible via use of at least one appliance and machine readable data indicative of an identify of the media source represented by the indicia of the overlay;
a reading device adapted to read the data indicative of the media source from the overlay received by the configurable key;
a memory for storing a library of command codes for use in transmitting commands to control one or more functional operations of one or more appliances and for storing a correspondence between the configurable key and data indicative of the media source represented by the indicia of the overlay wherein the correspondence is attained through use of the data indicative of the identity of the media source read from the overlay received by the configurable key; and
programming for configuring the controlling device whereupon, in response to an activation of the configurable key, the controlling device uses select command codes from the library of command codes and the correspondence between the configurable key and the data indicative of the media source represented by the indicia of the overlay to transmit one or more commands for causing one or more appliances to access the media content associated with the media source.

2. The controlling device as recited in claim 1, wherein the overlay comprises an RFID tag having the machine readable data indicative of the identity of media source and the reading device comprises an RFID tag reader.

3. The controlling device as recited in claim 1, wherein the overlay comprises a binary encoded representation of the machine readable data indicative of the identity of the media source and the reading device comprises a device for reading the binary encoded representation.

4. The controlling device as recited in claim 3, wherein the binary encoded representation comprises conductive material positioned at one or more predetermined locations on the overlay and the reading device comprises a device for sensing the presence of conductive material at the one or more predetermined locations.

5. The controlling device as recited in claim 1, wherein the overlay comprises a sticker.

6. The controlling device as recited in claim 5, wherein the configurable key comprises a device for limiting positioning of the sticker with respect to the configurable key.

7. The controlling device as recited in claim 1, wherein the memory maintains a key assignment table in which is maintained a correspondence between the configurable key and the data indicative of the identity of the media source and a channel map table in which is maintained a correspondence between data indicative of the identity of the media source and data indicative of a channel number corresponding to the media source.

8. The controlling device as recited in claim 7, wherein the channel map table is downloaded into the memory of the controlling device from a source external to the controlling device.

9. A method for configuring a controlling device having a configurable key and a library of commands for commanding operating functions of one or more appliances, the method comprising:
reading from an overlay having an indicia that has been associated with the configurable key data indicative of an identity of a media source having an associated media content that is accessible via use of at least one appliance;
storing in a memory of the controlling device a correspondence between the configurable key and data indicative of the media source indicated to the controlling device via the data read from the overlay; and
in response to a subsequent activation of the configurable key, causing the controlling device to use select command codes from the library of command codes and the correspondence between the configurable key and the data indicative of the media source indicated by the data read from the overlay to transmit one or more commands for causing one or more appliances to access the media content associated with the media source.

10. The method as recited in claim 9, wherein the overlay comprises an RFID tag having the machine readable data indicative of the identity of the media source and the step of reading the machine readable data comprises reading the RFID tag.

11. The method as recited in claim 9, wherein the overlay comprises a binary encoded representation of the machine readable data indicative of the identity of the media source and the step of reading the machine readable data comprises reading the binary encoded representation.

12. The method as recited in claim 9, wherein the step of reading the machine readable data indicative of the identity of the media source is performed in response to activation of one or more predetermined keys of the controlling device provided for placing the controlling device into a configuration mode.

13. The method as recited in claim 9, comprising storing in the memory of the controlling device a key assignment table in which is maintained a correspondence between the configurable key and the data indicative of the identity of the media source and a channel map table in which is maintained a correspondence between data indicative of the identity of the media source and data indicative of a channel number corresponding to source of the media source content.

14. The method as recited in claim 13, comprising downloading the channel map table from a source external to the controlling device.

15. The method as recited in claim 14, wherein the channel map table downloaded is reflective of a set of overlays to which the overlay belongs.

16. The method as recited in claim 14, wherein the channel map table downloaded is reflective of a geographical location of the controlling device.

17. The method as recited in claim 14, wherein the channel map table downloaded is reflective of a provider of media sources which includes the the media source.

18. The method as recited in claim 17, wherein the channel map table downloaded is reflective of a level of service with the provider of media sources.

19. The method as recited in claim 13, wherein the channel map table is manually entered into the controlling device.

20. The method as recited in claim 9, wherein the overlay comprises a sticker.

* * * * *